US008686444B2

United States Patent
Kim et al.

(10) Patent No.: US 8,686,444 B2
(45) Date of Patent: Apr. 1, 2014

(54) ORGANIC LIGHT EMITTING DEVICE AND METHOD OF MANUFACTURING THE SAME

(75) Inventors: Yong-Tak Kim, Yongin (KR); Jong-Hyuk Lee, Yongin (KR); Won-Jong Kim, Yongin (KR); Joon-Gu Lee, Yongin (KR); Jin-Baek Choi, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 278 days.

(21) Appl. No.: 12/814,727

(22) Filed: Jun. 14, 2010

(65) Prior Publication Data

US 2011/0121270 A1 May 26, 2011

(30) Foreign Application Priority Data

Nov. 25, 2009 (KR) ........................ 10-2009-0114632

(51) Int. Cl.
*H01L 21/00* (2006.01)
*H01L 29/18* (2006.01)
*H01L 33/00* (2010.01)

(52) U.S. Cl.
USPC ................... 257/88; 257/40; 257/43; 438/38

(58) Field of Classification Search
USPC ............ 257/40, E51.018, 72, 88, 43; 438/38, 438/149
See application file for complete search history.

(56) References Cited

U.S. PATENT DOCUMENTS

| 6,734,625 B2 | 5/2004 | Vong et al. | |
| 6,878,871 B2 * | 4/2005 | Scher et al. | 136/252 |
| 7,642,203 B2 * | 1/2010 | Kim | 438/786 |
| 2001/0034088 A1 * | 10/2001 | Nakamura et al. | 438/166 |
| 2003/0027369 A1 | 2/2003 | Yamazaki | |
| 2004/0012331 A1 * | 1/2004 | Yamazaki et al. | 313/506 |
| 2004/0185301 A1 | 9/2004 | Tsuchiya et al. | |
| 2004/0197944 A1 * | 10/2004 | Chen et al. | 438/26 |
| 2005/0051763 A1 | 3/2005 | Affinito et al. | |
| 2005/0253503 A1 * | 11/2005 | Stegamat et al. | 313/504 |
| 2006/0003501 A1 * | 1/2006 | Kakkad et al. | 438/149 |
| 2008/0157094 A1 * | 7/2008 | Seo et al. | 257/72 |
| 2009/0174322 A1 * | 7/2009 | Chan et al. | 313/504 |

FOREIGN PATENT DOCUMENTS

| KR | 1020020080067 A | 10/2002 |
| KR | 2003-0004128 A | 1/2003 |
| KR | 10-2005-0084297 A | 8/2005 |
| KR | 10-2006-0001709 A | 1/2006 |
| KR | 1020070060973 A | 6/2007 |
| KR | 1020080088750 A | 10/2008 |

OTHER PUBLICATIONS

Korean Office action issued by KIPO on Nov. 3, 2011, corresponding to KR 10-2009-0114632 and Request for Entry attached herewith.

* cited by examiner

*Primary Examiner* — George Fourson, III
*Assistant Examiner* — Wilner Jean Baptiste
(74) *Attorney, Agent, or Firm* — Robert E. Bushnell, Esq.

(57) ABSTRACT

An organic light emitting device including a substrate on which an organic light emitting unit is formed, wherein the organic light emitting unit sequentially includes a first electrode, an organic layer, and a second electrode; and a passivation layer covering the substrate and the second electrode, and a method of manufacturing the organic light emitting device.

20 Claims, 7 Drawing Sheets

ORGANIC LIGHT EMITTING DEVICE AND METHOD OF MANUFACTURING THE SAME

CROSS-REFERENCE TO RELATED PATENT APPLICATION

This application claims the benefit of Korean Patent Application No. 10-2009-0114632, filed on Nov. 25, 2009, in the Korean Intellectual Property Office, the disclosure of which is incorporated herein in its entirety by reference.

BACKGROUND OF THE INVENTION

Field of the Invention

The present invention relates to an organic light emitting device including a substrate on which an organic light emitting unit is formed, wherein the organic light emitting unit sequentially includes a first electrode, an organic layer, and a second electrode; and a passivation layer covering the substrate and the second electrode, and a method of manufacturing the same.

SUMMARY OF THE INVENTION

The present invention provides an organic light emitting device including a substrate on which an organic light emitting unit is disposed, wherein the organic light emitting unit sequentially includes a first electrode, an organic layer, and a second electrode; and first and second passivation layers that are sequentially stacked and cover the substrate and the organic light emitting unit, wherein a first intermixed layer is disposed between the substrate and the first passivation layer, the first intermixed layer comprising a component including the substrate, a component including the first passivation layer, and a component including implanted ions and a second intermixed layer is disposed between the first passivation layer and the second passivation layer covering the first passivation layer, the second intermixed layer comprising a component including the first passivation layer, a component including the second passivation layer, and a component including implanted ions whereby permeation of moisture into the organic light emitting device is prevented.

The present invention also provides a method of manufacturing an organic light emitting device.

According to an aspect of the present invention, there is provided an organic light emitting device including: a substrate on which an organic light emitting unit is formed, wherein the organic light emitting unit sequentially comprises a first electrode, an organic layer, and a second electrode; and first and second passivation layers that are sequentially stacked and cover the substrate and the organic light emitting unit, wherein a first intermixed layer is formed between the substrate and the first passivation layer, the first intermixed layer formed of a component of the substrate, a component of the first passivation layer, and a component of ions implanted, and a second intermixed layer is formed between the first passivation layer and the second passivation layer, the second intermixed layer formed of a component of the first passivation layer, a component of the second passivation layer, and a component of ions implanted.

The component of ions implanted may include at least one selected from the group consisting of helium (He), neon (Ne), argon (Ar), krypton (Kr), xenon (Xe), $N_2$, and $O_2$.

The first passivation layer and the second passivation layer may be formed of different components, and the components may each independently include one selected from is the group consisting of a metal, an oxide, a nitride, a nitric oxide, and any mixtures thereof.

The metal may be any one of aluminum (Al), silver (Ag), ytterbium (Yb), silicon (Si), titanium (Ti), tungsten (W), zinc (Zn), magnesium (Mg), and nickel (Ni).

The oxide may be any one of $MoO_x$ where x=2-4, $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, and ZrO.

The nitride may be any one of AlN, BN, NbN, SiN, TaN, TiN, VN, YbN, and ZrN.

The nitric oxide may be SiON or AlON.

Each of the first passivation layer and the second passivation layer may have a light transmissivity in a range of about 90%, to about 100%.

The substrate may include glass, plastic, polymer, or metal.

The thickness of each of the first intermixed layer and the second intermixed layer may be in a range of above 0 to about 6,000 nm.

In the first intermixed layer and the second intermixed layer, the concentration of the component of the first passivation layer and the concentration of the component of the second passivation layer may gradually decrease in directions from the first passivation layer to the substrate and from the second passivation layer to the substrate, respectively.

According to another aspect of the present invention, there is provided a method of manufacturing an organic light emitting device, the method including: preparing a substrate on which an organic light emitting unit is formed, wherein the organic light emitting unit sequentially comprises a first electrode, an organic layer, and a second electrode; forming a first passivation layer on the substrate and the organic light emitting unit; implanting ion beams onto the first passivation layer; forming a second passivation layer on the first passivation layer; and implanting ion beams onto the second passivation layer.

The first passivation layer and the second passivation layer may be formed of different components, and the components may each independently include one selected from the group consisting of a metal, an oxide, a nitride, a nitric oxide, and any mixtures thereof.

The metal may be any one of Al, Ag, Yb, Si, Ti, W, Zn, Mg, and Ni.

The oxide may be any one of $MoO_x$ where x=2-4, $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, and ZrO.

The nitride may be any one of AlN, BN, NbN, SiN, TaN, TiN, VN, YbN, and ZrN.

The nitric oxide may be SiON or AlON.

Each of the first passivation layer and the second passivation layer may have a light transmissivity in a range of about 90% to about 100%.

The substrate may include glass, plastic, polymer, or metal.

The ion beams may include at least one selected from the group consisting of He, Ne, Ar, Kr, Xe, $N_2$, and $O_2$.

The implanting of the ions into the first passivation layer may include implanting ion beams into portions of the first passivation layer except for a portion of the first passivation layer covering the organic light emitting unit to form a first intermixed layer between the substrate and the first passivation layer, wherein the first intermixed layer is formed of a component of the substrate, a component of the first passivation layer, and a component of implanted ions.

The implanting of ions into the second passivation layer may include implanting ion beams into the entire surface of the second passivation layer to form a second intermixed layer between the first passivation layer and the second passivation layer, wherein the second intermixed layer is formed of a component of the first passivation layer, a component of the second passivation layer, and a component of implanted ions.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

To prevent moisture from permeating into electronic devices, methods of encapsulating an electronic device using adhesives are currently used. In this method, however, a small amount of moisture still permeates into the electronic device and thus moisture absorbents are used to completely remove the moisture permeated thereinto. However, since such moisture absorbents are opaque, multi-layers, such as ten layers or greater of a transparent thin film are used. However, the deposition of multi-layers creates problems in terms of transparency, tact time, and stress of the multi-layers of thin film. Therefore, as an alternative, research into a stacked structure formed of an organic compound and an inorganic compound is ongoing.

Multi-layered structures formed of organic and inorganic compounds have received much recent attention. However, it is difficult to manufacture an organic light emitting device including such structures due to problems in transparency and tact time.

In addition, permeation of moisture into an organic light emitting device from a corner on which poor step coverage of the organic light emitting device is formed is not completely blocked, rather than permeation of moisture into an organic light emitting device from an upper portion of a passivation layer. Thus, organic light emitting devices are damaged by moisture permeation at corners.

The present invention will now be described in more detail with reference to the accompanying drawings.

An organic light emitting device according to an embodiment of the present invention includes a substrate on which an organic light emitting unit is disposed, wherein the organic light emitting unit sequentially includes a first electrode, an organic layer, and a second electrode; and first and second passivation layers that are sequentially stacked and cover the substrate and the organic light emitting unit, wherein a first intermixed layer is disposed between the substrate and the first passivation layer, the intermixed layer comprised of a component including the substrate, a component including the first passivation layer, and a component including implanted ions, and a second intermixed layer is disposed between the first passivation layer and the second passivation layer, the second intermixed layer comprised of a component including the first passivation layer, a component including the second passivation layer, and a component including implanted ions.

To obtain stable operation and long lifetime of various electronic devices susceptible to moisture, a getter for absorbing moisture or moisture absorbent is used in the devices, or sealants or frits are used in upper and lower glasses. Most recently, a passivation layer formed of a single inorganic thin film or a multi-layered inorganic thin film has been used in organic devices.

In the case of the multi-layered inorganic thin film, stresses occur, tact time is consumed, and transmittance is poor.

Figure 1:
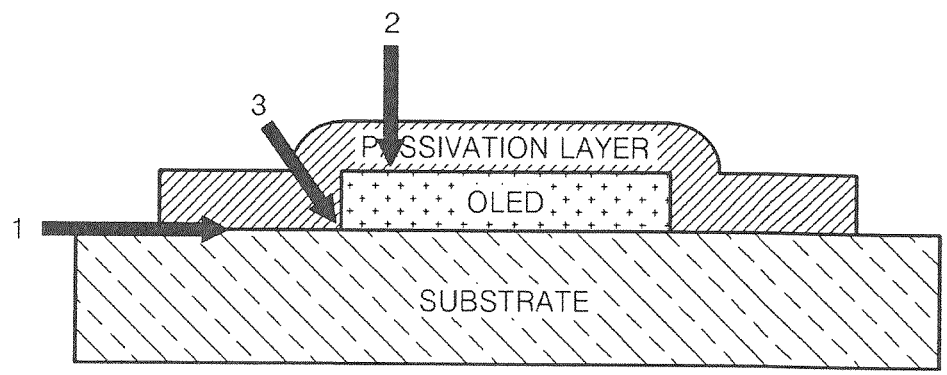
FIG. 1 is a view illustrating routes through which moisture permeates into an organic light emitting device.

An important consideration is the process by which moisture permeates into the organic light emitting device. FIG. 1 is a view illustrating routes through which moisture permeates into an organic light emitting device. Referring to FIG. 1, the routes of moisture permeation are categorized into route 1 through which moisture permeates into the organic light emitting device via an interface between a substrate, such as glass and a passivation layer, route 2 through which moisture permeates into the organic light emitting device from an upper portion of the passivation layer, and route 3 through which moisture permeates into the organic light emitting device from a corner on which step coverage of the organic light emitting device is formed. To completely prevent moisture permeation, several micrometers of a thin film is necessary and is time-consuming to prepare. Routes 1 and 3 among the routes of moisture permeation mentioned above are particularly problematic.

According to an embodiment of the present invention, by irradiating ions into the substrate and the first passivation layer by ion implantation under appropriate conditions, the first intermixed layer formed of the component of the substrate, the component of the first passivation layer and the component of implanted ions may be formed between the substrate and the first passivation layer.

In addition, by irradiating ions into the first passivation layer and the second passivation layer under appropriate conditions, the second intermixed layer formed of the component of the first passivation layer, the component of the second passivation layer and its the component of implanted ions may be formed between the first passivation layer and the second passivation layer.

The formation of the first intermixed layer and the second intermixed layer depends on various conditions, such as a type of the first passivation layer, a type of the second passivation layer, a kind of ions, ion implantation voltage, ion implantation pressure, ion implantation time, and the depths of the first and second intermixed layers. Several examples will be described herein.

As described above, the first and second intermixed layers are respectively formed between the substrate and the first passivation layer and between the first passivation layer and the second passivation layer without clear interfaces therebetween. Thus, moisture permeation is effectively prevented.

The first passivation layer and the second passivation layer may be formed of different components, and may be formed of one material selected from the group consisting of a metal, an oxide, a nitride, a nitric oxide, and any mixtures thereof.

The metal may be aluminum (Al), silver (Ag), ytterbium (Yb), silicon (Si), titanium (Ti), tungsten (W), zinc (Zn), magnesium (Mg), or nickel (Ni). The oxide may be $MoO_x$ where x=2-4, $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, or ZrO. The nitride may be AlN, BN, NbN, SiN, TaN, TiN, VN, YbN, or ZrN. The nitric oxide may be SiON or AlON.

Figure 2A:
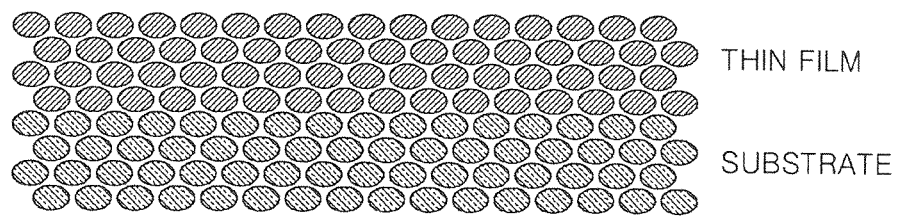
FIGS. 2A through 2C are views sequentially illustrating a principle of forming a intermixed layer by irradiating ions into a substrate and a passivation layer by ion implantation, according to embodiments of the present invention.
Figure 2B:
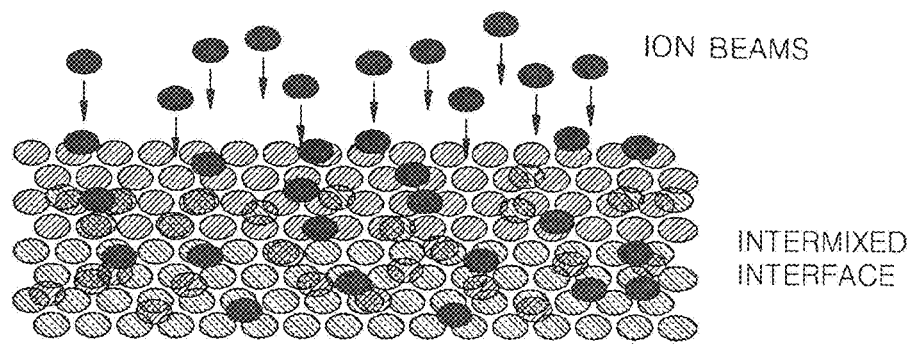
Figure 2C:
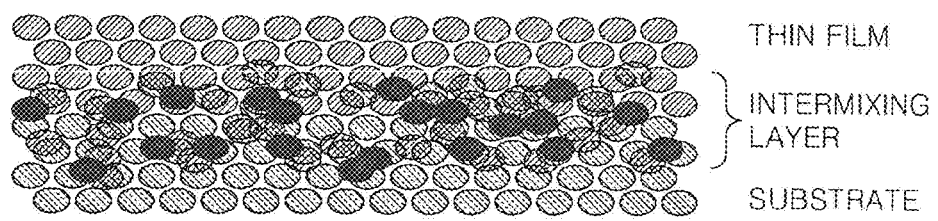

FIGS. 2A through 2C are views sequentially illustrating a principle of forming an intermixed layer by irradiating ions into a substrate and a passivation layer by ion implantation, according to embodiments of the present invention.

Referring to FIG. 2A, an interface between a substrate and a passivation layer formed thereon is clearly shown.

Referring to FIG. 2B, ions with energy are implanted into the interface between the substrate and the passivation layer, thereby activating an interface surface therebetween. Gas used may be an inert gas, such as helium (He), neon (Ne), argon (Ar), or xenon (Xe), and, also, may be $N_2$ or $O_2$ gas. When the gas is ionized and the ionized gas is implanted, ions may blur the clear interface between the substrate and the passivation layer under appropriate operating conditions. Through the ion implantation, an intermixed layer as illustrated in FIG. 2C is formed.

Referring to FIG. 2C, the interface between the substrate and the passivation layer is not clear unlike as in FIG. 2A. The substrate and the passivation layer are firmly adhered to each other. Thus, permeation of moisture thereinto is difficult.

The component of implanted ions may be at least one selected from the group consisting of He, Ne, Ar, Kr, Xe, $N_2$, and $O_2$.

The first passivation layer and the second passivation layer respectively may have a light transmissivity in a range of about 90% to about 100%.

When the light transmissivity of each of the first and second passivation layers is less than 90%, efficiency and viewing angle problems may occur.

The substrate may be formed of a material generally used in a substrate, for example, glass, plastic, polymer, or metal.

The thickness of each of the first and second intermixed layers may be in a range of above 0 to about 6,000 nm.

When the thickness of each intermixed layer is greater than 6,000 nm, the first and second intermixed layers may be broken due to stress.

In the first intermixed layer and the second intermixed layer, the concentration of the component of the first passivation layer and the concentration of the component of the second passivation layer may gradually decrease in directions from the first passivation layer to the substrate and from the second passivation layer to the substrate, respectively.

Figure 3:
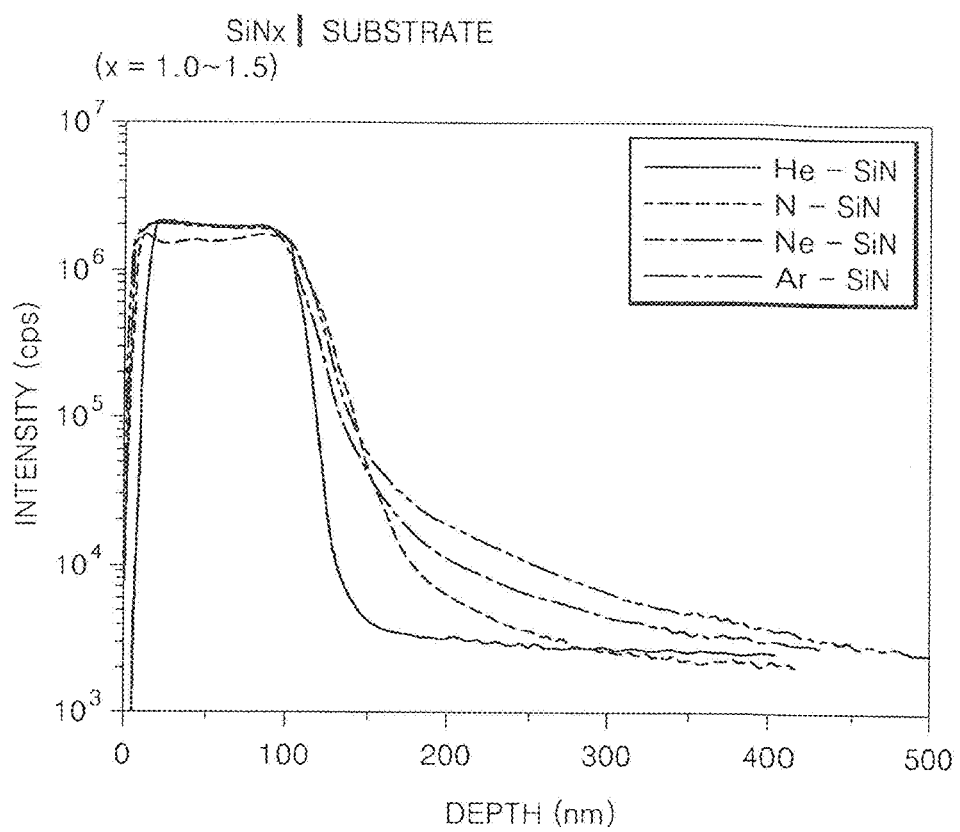
FIG. 3 is a graph showing analysis results of intermixed layers using a secondary ion mass spectroscopy (SIMS), wherein each of the intermixed layers is formed such that $SiN_x$ where x=1.0-1.5 is deposited on a glass substrate, and ions of any one gas of He, $N_2$, Ne, and Ar are implanted thereonto, according to an embodiment of the present invention.

FIG. 3 is a graph showing analysis results of intermixed layers using secondary ion mass spectroscopy (SIMS), wherein each of the intermixed layers is formed such that a layer formed of nitride, such as $SiN_x$ where x=1.0-1.5 is deposited on a glass substrate, and ions of any one gas of He, $N_2$, Ne, and Ar are implanted thereonto, according to an embodiment of the present invention.

Referring to FIG. 3, as the atomic numbers of the ion components implanted increase, sharpness of an interface between the nitride layer and the glass substrate decreases. In other words, a degree of broadening of the interfaces satisfies the following inequality Ar>Ne>N>He (ions are implanted in the same dose and projected ranges (Rp) are almost the same in the four cases).

In addition, referring to the horizontal axis of the graph illustrated in FIG. 3, the depth of each intermixed layer is in a range of about 100 nm to about 500 nm. In each intermixed layer, the concentration of SiN gradually decreases in a direction from the passivation layer (formed of $SiN_x$) to the substrate (formed of glass).

Hereinafter, a method of manufacturing an organic light emitting device, according to an embodiment of the present invention will be described.

The method includes: preparing a substrate on which an organic light emitting unit is formed, wherein the organic light emitting unit sequentially includes a first electrode, an organic layer, and a second electrode; forming a first passivation layer on the substrate and the organic light emitting unit; implanting ions into the first passivation layer; forming a second passivation layer on the first passivation layer; and implanting ions into the second passivation layer.

FIGS. 4A through 4E are views sequentially illustrating a method of manufacturing an organic light emitting device according to an embodiment of the present invention.

Figure 4A:
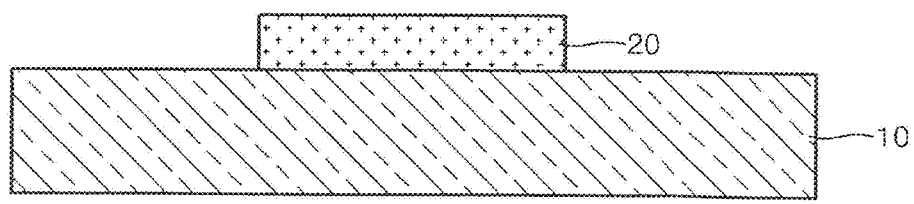
FIGS. 4A through 4E are views sequentially illustrating a method of manufacturing an organic light emitting device according to an embodiment of the present invention.

Referring to FIG. 4A, first, a substrate 10 on which an organic light emitting unit 20 is formed is prepared, wherein the organic light emitting unit 20 sequentially includes a first electrode, an organic layer, and a second electrode. The substrate may be formed of a material generally used in a substrate of an organic light emitting device, for example, glass, plastic, polymer, or metal.

Figure 4B:
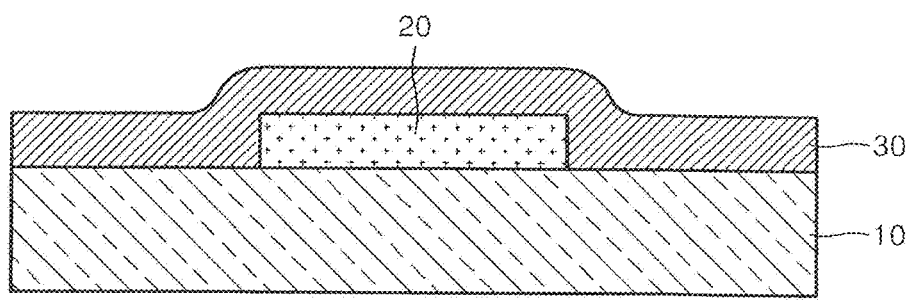

Referring to FIG. 4B, a first passivation layer 30 is formed on the substrate 10 and the organic light emitting unit 20. The first passivation layer 30 may be formed of a material generally used in a passivation layer of an organic light emitting device. For example, the first passivation layer 30 may be formed of one material selected from the group consisting of a metal, an oxide, a nitride, a nitric oxide, and any mixtures thereof. The metal may be Al, Ag, Yb, Si, Ti, W, Zn, Mg, or Ni. The oxide may be $MoO_x$ where x=2-4, $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, or ZrO. The nitride may be AlN, BN, NbN, SiN, TaN, TIN, VN, YbN, or ZrN. The nitric oxide may be SiON or AlON.

The first passivation layer may have a light transmissivity in a range of about 90% to about 100%. When the light transmissivity of the first passivation layer is less than 90%, efficiency and viewing angle problems may occur.

Figure 4C:
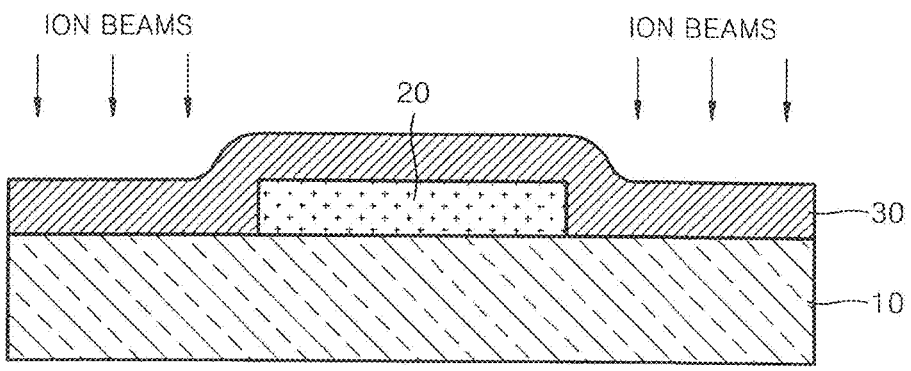

Referring to FIG. 4C, ions are implanted into the first passivation layer 30. The ion beams may be formed of at least one selected from the group consisting of He, Ne, Ar, Kr, Xe, $N_2$, and $O_2$. In this regard, the ion beams are implanted into portions of the first passivation layer 30 except for a portion of the first passivation layer 30 covering the organic light emitting unit 20. As a result, a first intermixed layer (not shown) is formed between the substrate 10 and the first passivation layer 30, wherein the first intermixed layer is formed of a component of the substrate 10, a component of the first passivation layer 30, and a component including implanted ions.

The reason which the ion beams are not implanted into the portion of the first passivation layer 30 covering the organic light emitting unit 20 is to prevent the organic light emitting unit 20 from being damaged by the ion beams.

Figure 4D:
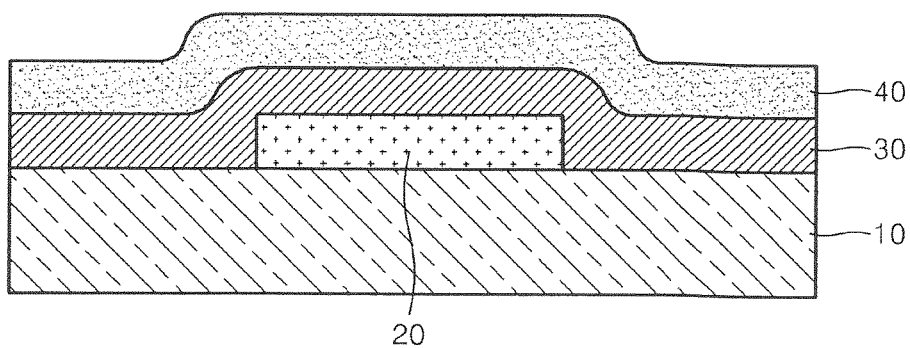

Referring to FIG. 4D, a second passivation layer 40 is formed on the first passivation layer 30. The second passivation layer 40 may be formed of a material generally used in a passivation layer of an organic light emitting device. For example, the second passivation layer 40 may be formed of one material selected from the group consisting of a metal, an oxide, a nitride, a nitric oxide, and any mixtures thereof. The second passivation layer 40 may have a light transmissivity in a range of about 90% to about 100%. When the light transmissivity of the second passivation layer 40 is less than 90%, efficiency and viewing angle problems may occur.

The second passivation layer 40 may be formed of a material different from that of the first passivation layer 30. For example, when the first passivation layer 30 is formed of a metal, the second passivation layer 40 may be formed of an oxide or a nitride. Alternatively, when the first passivation layer 30 is formed of an oxide, the second passivation layer 40 may be formed of a metal or a nitride, and, when the first passivation layer 30 is formed of a nitride, the second passivation layer 40 may be formed of a metal or an oxide.

Figure 4E:
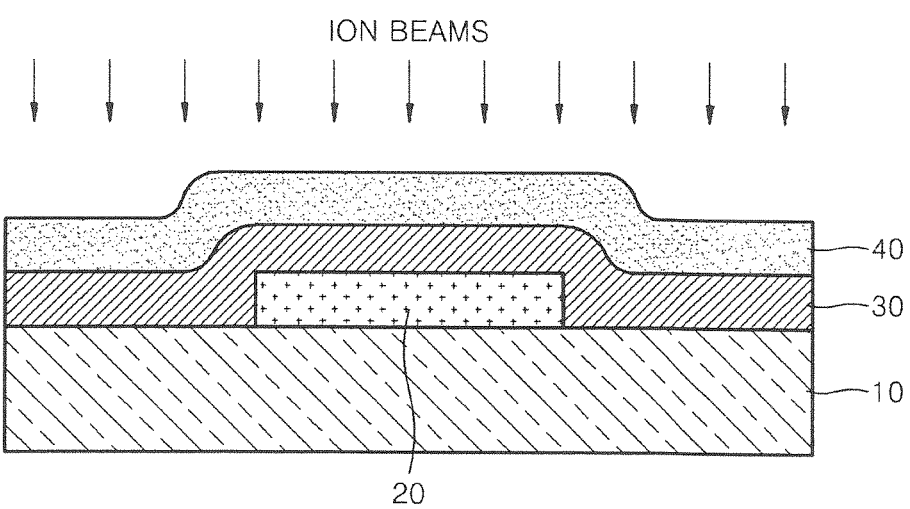

Referring to FIG. 4E, ion beams are implanted into the second passivation layer 40. The ion beams may be formed of at least one selected from the group consisting of He, Ne, Ar, Kr, Xe, $N_2$, and $O_2$. In this regard, the ion beams are implanted into the entire surface of the second passivation layer 40. As a result, a second intermixed layer (not shown) is formed between the first passivation layer 30 and the second passivation layer 40, wherein the second intermixed layer is formed of the component of the first passivation layer 30, a component of the second passivation layer 40, and a component of ions implanted.

Figure 5:
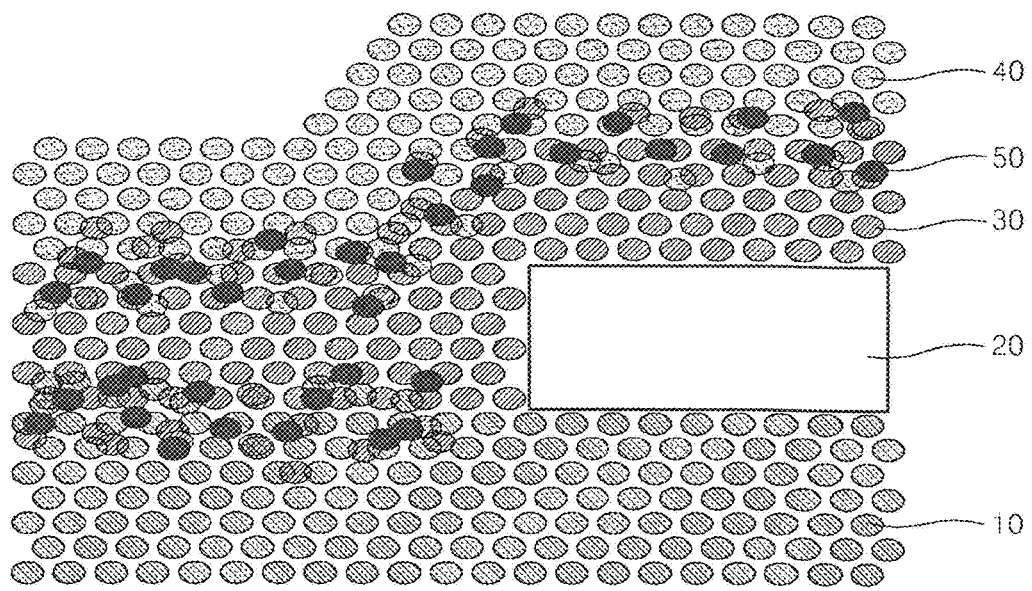
FIG. 5 is an enlarged view of a portion of an organic light emitting device according to an embodiment of the present invention.

FIG. 5 is an enlarged view of a portion of an organic light emitting device according to an embodiment of the present invention.

Referring to FIG. 5, the first intermixed layer is formed between the substrate 10 and the first passivation layer 30, and is formed of a component of the substrate 10, a component of the first passivation layer 30, and a component 50 of ions implanted. The second intermixed layer is formed between the first passivation layer 30 and the second passivation layer 40, and is formed of the component of the second passivation layer 40, a component of the first passivation layer 30, and the component 50 including implanted ions. The component 50 including implanted ions does not exist in the vicinity of the organic light emitting unit 20.

Due to the formation of the first and second intermixed layers, the routes 1 through 3 of moisture permeation illustrated in FIG. 1 are efficiently blocked.

The organic light emitting device according to the present invention includes a simpler passivation layer than ten layers of a passivation layer commonly used in the art, thereby effectively reducing tact time. As a result, the manufacturing processes become simpler.

Hereinafter, a structure of a general organic light emitting device used in the present invention will be described.

The organic light emitting device may have various structures. An organic layer may be formed between a first electrode and a second electrode. The organic layer may include at least one layer selected from the group consisting of a hole injection layer, a hole transport layer, an emissive layer, a hole blocking layer, an electron transport layer, and an electron injection layer.

The organic light emitting device may have a first electrode/hole injection layer/hole transport layer/emissive layer/electron transport layer/electron injection layer/second electrode structure or a first electrode/hole injection layer/hole transport layer/emissive layer/hole blocking layer/electron transport layer/electron injection layer/second electrode structure.

Hereinafter, a method of manufacturing the organic light emitting device having such stacked structure as described above will be described.

First, a negative electrode forming material having a high work function is deposited or sputtered on a substrate to form a first electrode, which may be used as a negative electrode. The substrate may be any substrate used in conventional organic light emitting devices such as a glass substrate or a transparent plastic substrate, which has superior transparency, surface smoothness, ease of treatment, and waterproof properties. The negative electrode forming material may be a transparent and highly conductive material, such as indium tin oxide (ITO), indium zinc oxide (IZO), tin oxide ($SnO_2$) or zinc oxide (ZnO).

A hole injecting material is vacuum thermal deposited or spin-coated on the negative electrode. The hole injecting material may be a phthalocyanine compound, such as CuPC or copperphthalocyanine, a star-burst type amine derivative, such as TCTA, m-MTDATA, or m-MTDAPB, or soluble conductive polymers such as polyaniline/dodecylbenzenesulfonic acid (Pani/DBSA) or poly(3,4-ethylenedioxythiophene)/poly(4-styrenesulfonate) (PEDOT/PSS), polyaniline/camphor sulfonicacid (Pani/CSA) or polyaniline/poly(4-styrenesulfonate) (PANI/PSS), but are not limited thereto.

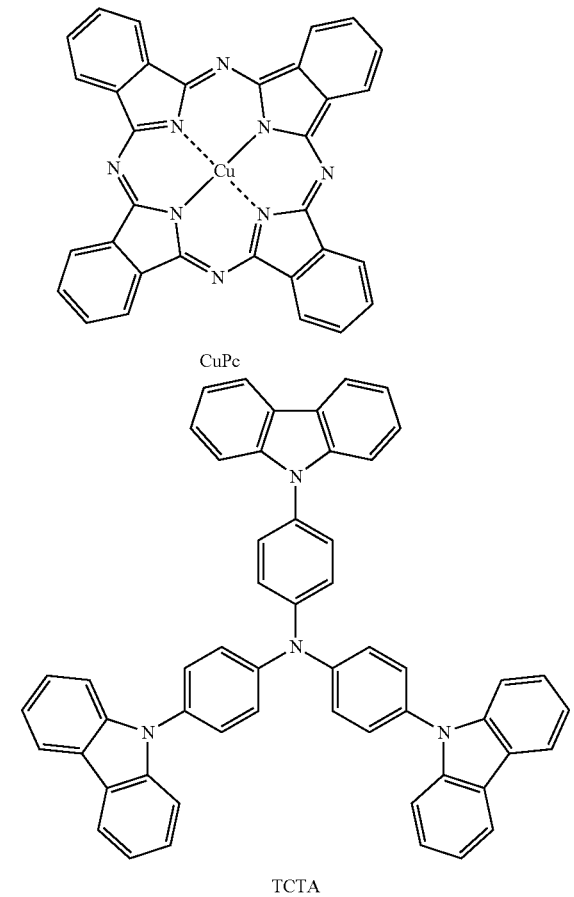

CuPc

TCTA

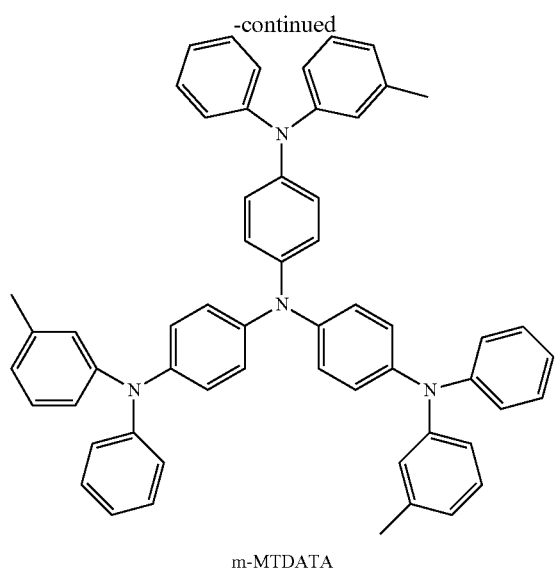

m-MTDATA

A hole transporting material is vacuum thermal deposited or spin-coated on the hole injection layer to form a hole transport layer. The hole transporting material may be 1,3,5-tricarbazolylbenzene, 4,4'-biscarbazolylbiphenyl, polyvinylcarbozole, m-biscarbazolylphenyl, 4,4'-biscarbazolyl-2,2'-dimethylbiphenyl, 4,4',4''-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), N,N'-diphenyl-N,N'-bis(1-naphthyl)-(1,1'-biphenyl)-4,4'-diamine (NPB), poly(9,9-dioctylfluorene-co-N-(4-butylphenyl)diphenylamine) (TFB), or poly(9,9-dioctylfluorene-co-bis-N,N-phenyl-1,4-phenylenediamine (PFB), but is not limited thereto.

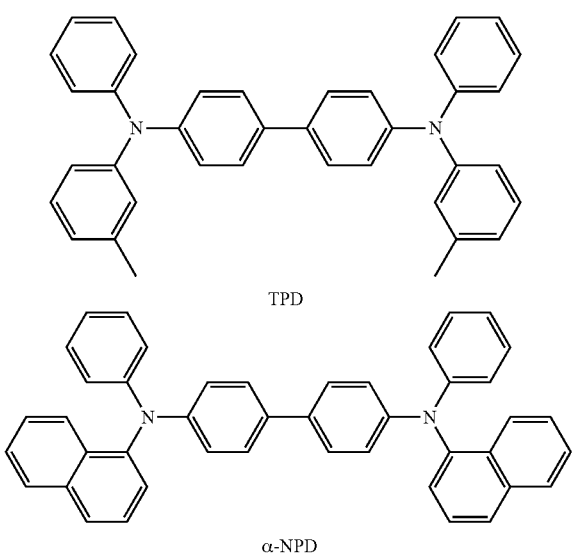

TPD

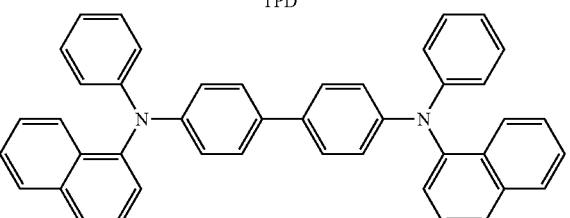

α-NPD

Next, an emissive layer is formed on the hole transport layer. An emissive material is not particularly limited, and 4,4'-biscarbazolylbiphenyl(CBP), TCB, TCTA, SDI-BH-18, SDI-BH-19, SDI-BH-22, SDI-BH-23, dmCBP, Liq, TPBI, Balq, or BCP may be used as a host. As for a dopant, IDE102 and IDE105 available from Idemitsu Co. as a fluorescent dopant, a well-known green phosphorescent dopant Ir(ppy)3, a blue phosphorescent dopant (4,6-F2ppy)2Irpic, or the like can be co-deposited by vacuum thermal deposition.

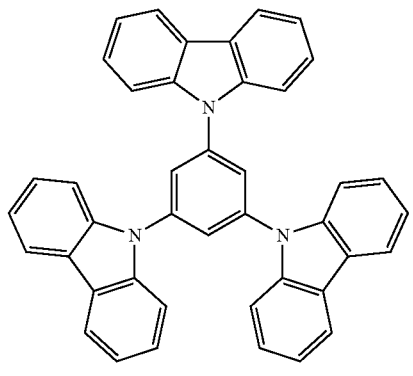

TCB

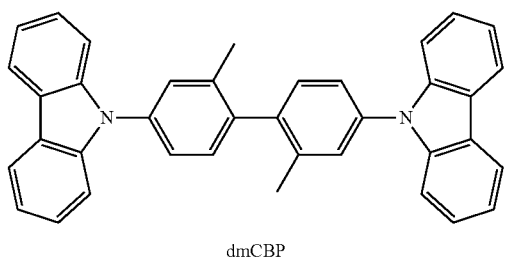

dmCBP

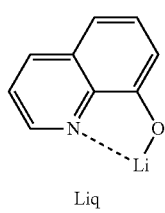

Liq

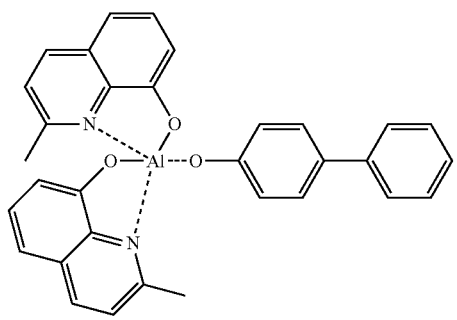

Balq

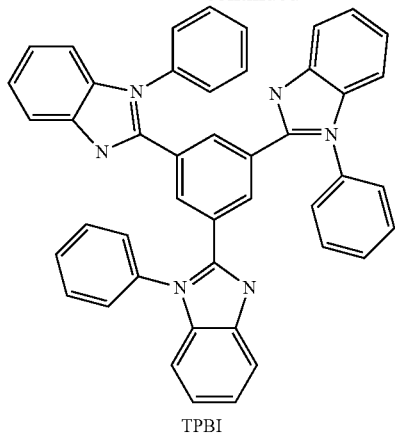

TPBI

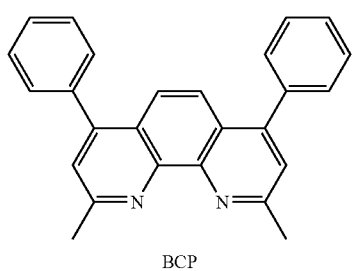

BCP

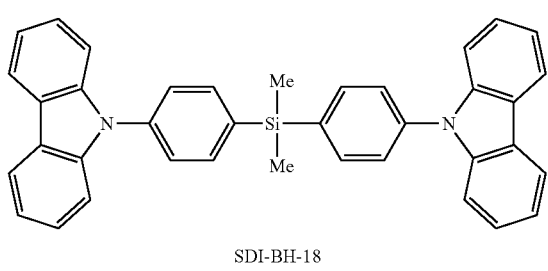

SDI-BH-18

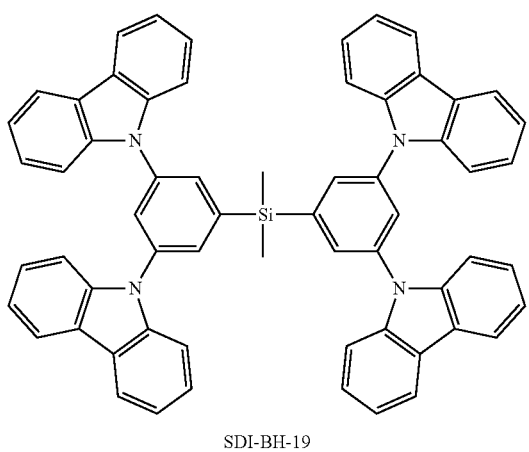

SDI-BH-19

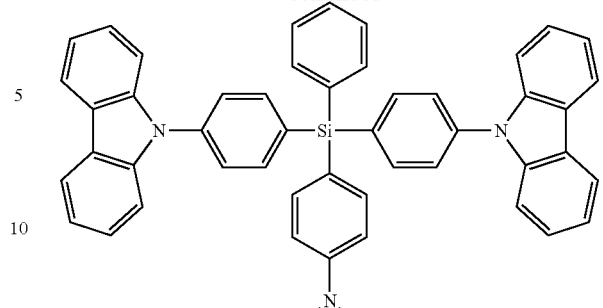

SDI-BH-22

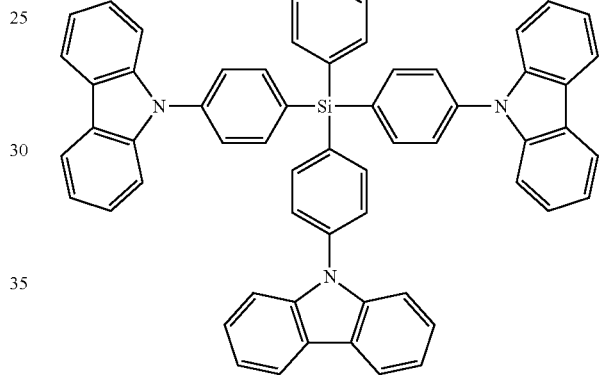

SDI-BH-23

A doping concentration is not particularly limited, but conventionally in the range of about 0.5 to about 12 wt %. An electron transport layer may be formed on the emissive layer by vacuum deposition or spin coating.

When a phosphorescent dopant is used to form the emissive layer, a hole blocking material is additionally vacuum thermal deposited on the emissive layer to form a hole blocking layer, in order to prevent triplet excitons or holes from migrating into the electron transport layer. A hole blocking material used herein is not particularly limited, but has to provide the ability to transport electrons and have higher ionization potential than a light emitting compound. For example, the hole blocking material may be Balq, BCP, or the like.

An electron transport layer may be formed as a thin film on the hole blocking layer by vacuum deposition or spin coating.

An electron transporting material may be a known material, such as $Alq_3$.

An electron injection layer may be formed on the electron transport layer. An electron injecting material may be LiF, NaCl, CsF, $Li_2O$, or BaO, but is not limited thereto.

Next, a positive electrode forming metal is vacuum thermal deposited on the electron injection layer to form a positive electrode. The positive electrode forming metal may be lithium (Li), magnesium (Mg), aluminum (Al), aluminum-lithium (Al—Li), calcium (Ca), magnesium-indium (Mg—

In), or magnesium-silver (Mg—Ag). In addition, in the structure of an electrode, a hole injection layer, a hole transport layer, an emissive layer, a hole blocking layer, an electron transport layer, an electron injection layer and a positive electrode, a transparent positive electrode made of ITO or IZO may be used as the positive electrode in order to obtain one layer top-emitting device. An organic light emitting device according to the present invention may further include a negative electrode or a dual-layered intermediate layer.

Next, a passivation layer is formed on the positive electrode and the substrate using the method as described above and ions are implanted thereonto, thereby completing the manufacturing of the organic light emitting device.

One or more embodiments of the present invention will now be described in further detail with reference to the following examples. However, these examples are for illustrative purposes only and are not intended to limit the scope of the invention.

EXAMPLES

Example 1 m-MTDATA(750 Å)/α-NPD(150 Å)/DSA(300 Å):TBPe(3%)/Alq3(200 Å)/LiF(80 Å)/Al(3000 Å)

As a negative electrode, a 15 Ω/cm$^2$ (1200 Å) Corning ITO glass substrate was cut to a size of 50 mm×50 mm×0.7 mm, washed with ultrasonic waves in isopropyl alcohol and pure water for 5 minutes each, and then cleaned with UV and ozone for 30 minutes. m-MTDATA was vacuum-deposited on the glass substrate to form a hole injection layer having a thickness of 750 Å. Then, α-NPD was vacuum deposited on the hole injection layer to form a hole transport layer having a thickness of 150 Å. Next, DSA used as a host and 3% of TBPe used as a dopant were vacuum deposited on the hole transport layer to form an emissive layer having a thickness of 300 Å. Then, Alq$_3$ was vacuum deposited on the emissive layer to form an electron transport layer having a thickness of 200 Å. 80 Å of LiF (electron injection layer) and 3000 Å of Al (positive electrode) were sequentially vacuum deposited on the electron transport layer to form an LiF/Al electrode. Finally, the manufacturing of an organic light emitting device was completed.

Next, SiN$_x$ where x=1.2-1.4 was deposited on the substrate and the LiF/Al electrode in a thermal evaporator at a pressure of 2×10$^{-6}$ Torr to form a first passivation layer having a thickness of 5000 Å.

A portion of the first passivation layer, the portion covering an organic light emitting unit was screened, and then ions of N$_2$ (10 sccm) gas were implanted into the remaining portions of the first passivation layer at 40 kV at a pressure of 1×10$^{-6}$ torr in an ion dose of 1×10$^{17}$ ions/cm$^2$ for 60 minutes to form a first intermixed layer between the first passivation layer and the substrate.

Next, SiON was deposited on the first passivation layer to form a second passivation layer having a thickness of 9000 Å.

Then, ions of N$_2$ (10 sccm) gas were implanted into the entire surface of the second passivation layer at 60 kV at a pressure of 1×10$^{-6}$ torr in an ion dose of 1×10$^{17}$ ions/cm$^2$ for 80 minutes to form a second intermixed layer between the first passivation layer and the second passivation layer. As a result, the manufacturing of an organic light emitting device was completed.

Figure 6:
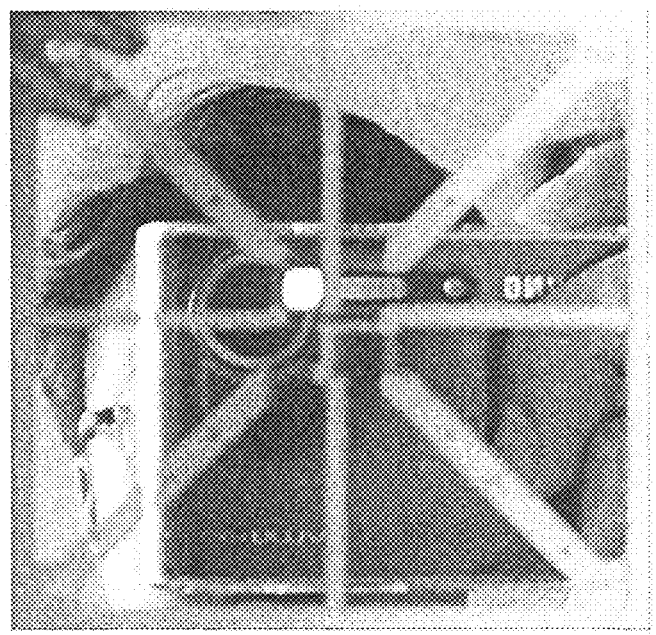
FIG. 6 is a photographic image showing that an organic light emitting device according to an embodiment of the present invention emits even at a high voltage without damage.

FIG. 6 is a photographic image showing that the organic light emitting device of Example 1 emits light. Referring to FIG. 6, it was observed that the organic light emitting device of Example 1 emitted even at a high voltage, i.e., 20 kV without damage.

Scanning electron microscopy (SEM) measurement was performed on a cross-section of the organic light emitting device of Example 1. As a result, it was confirmed that each of the first intermixed layer and the second intermixed layer had a thickness of about 300 nm.

As a result of the measurement, each of the first and second passivation layers had a light transmissivity of about 90%.

Example 2

An organic light emitting device was manufactured using the same method as in Example 1, except that the first passivation layer was formed of SiO$_2$, and the second passivation layer was formed of SiN$_x$.

As for the first passivation layer, ions of N$_2$ (10 sccm) gas were implanted into the first passivation layer at 30 kV at a pressure of 1×10$^{-6}$ torr in an ion dose of 1×10$^{17}$ ions/cm$^2$ for 70 minutes to form a first intermixed layer between the first passivation layer and the substrate. Then, ions of N$_2$ (10 sccm) gas were implanted into the entire surface of the second passivation layer at 60 kV at a pressure of 1×10$^{-6}$ torr in an ion dose of 1×10$^{17}$ ions/cm$^2$ for 90 minutes to form a second intermixed layer between the first passivation layer and the second passivation layer. As a result, the manufacturing of an organic light emitting device was completed.

Example 3

An organic light emitting device was manufactured using the same method as in Example 1, except that ions of O$_2$ gas (10 sccm) were implanted into the first passivation layer and the second passivation layer, respectively at 50 kV at a pressure of 2×10$^{-6}$ torr in an ion dose of 1×10$^{17}$ ions/cm$^2$ for 60 minutes.

Comparative Example

An encapsulation substrate on which an organic light emitting unit was formed was prepared, wherein the organic light emitting unit sequentially included a first electrode, an organic layer, and a second electrode. Subsequently, Ca powder having an average particle diameter of 100 nm or less was vacuum thermal deposited on the second electrode in a gas atmosphere to form a moisture absorbing layer.

Silicon nitride was vacuum deposited on the moisture absorbing layer formed of CaO to form an inorganic passivation layer. Then, the moisture absorbing layer formed of CaO was coated on the inorganic passivation layer using the same method as described above. An acryl-based resin was spin coated on the moisture absorbing layer to form an organic passivation layer. Then, the resulting structure was heat treated at 100° C. to obtain a second electrode/moisture absorbing layer/inorganic passivation layer/moisture absorbing layer/organic passivation layer structure.

Lastly, the resulting structure was adhered to a substrate. As a result, the manufacturing of an organic light emitting device was completed.

Permeation Tests of Moisture and Outside Air

Permeation of moisture and outside air into the organic light emitting device of Example 1 and the Comparative Example was evaluated.

As a result of evaluation, each of the organic light emitting devices of Example 1 and the Comparative Example had a permeability of 10$^{-5}$ g/m$^2$/day or greater. From the results, it can be seen that both organic light emitting devices had almost the same capability of preventing the permeation of moisture and outside air thereinto.

As described above, according to an embodiment of the present invention, energy is applied to an interface between a substrate and a passivation layer by ion implantation to form an intermixed layer between the substrate and the passivation layer, thereby removing the clear interface between the substrate and the passivation layer. Thus, permeation of moisture into an organic light emitting device including the intermixed layer is prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting device comprising:
a substrate on which an organic light emitting unit is disposed, wherein the organic light emitting unit sequentially comprising a first electrode, an organic layer, and a second electrode; and
a first and second passivation layers that are sequentially stacked and cover the substrate and the organic light emitting unit,
a first intermixed layer disposed between the substrate and the first passivation layer, the first intermixed layer comprising a component including the substrate, a component including the first passivation layer, and a component including implanted ions, and a second intermixed layer disposed between the first passivation layer and the second passivation layer, the second intermixed layer comprising a component including the first passivation layer, a component including the second passivation layer, and a component including implanted ions; and
in the first intermixed layer and the second intermixed layer, the concentration of the component of the first passivation layer and the concentration of the component of the second passivation layer gradually changing in directions extending from the first passivation layer and from the second passivation layer, respectively.

2. The organic light emitting device of claim 1, wherein the component including implanted ions comprises one or more selected from the group consisting of helium (He), neon (Ne), argon (Ar), krypton (Kr), xenon (Xe), $N_2$, and $O_2$.

3. The organic light emitting device of claim 1, wherein the first passivation layer and the second passivation layer comprise different components, and the components each independently comprises one selected from the group consisting of a metal, an oxide, a nitride, a nitric oxide, and any mixture thereof.

4. The organic light emitting device of claim 3, wherein the metal comprises one or more of aluminum (Al), silver (Ag), ytterbium (Yb), silicon (Si), titanium (Ti), tungsten (W), zinc (Zn), magnesium (Mg), or nickel (Ni).

5. The organic light emitting device of claim 3, wherein the oxide comprises one or more of $MoO_x$ where x=2-4, $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, or ZrO.

6. The organic light emitting device of claim 3, wherein the nitride comprises one or more of AlN, BN, NbN, SiN, TaN, TiN, VN, YbN, or ZrN.

7. The organic light emitting device of claim 3, wherein the nitric oxide comprises SiON or AlON.

8. The organic light emitting device of claim 1, wherein each of the first passivation layer and the second passivation layer has a light transmissivity in a range of about 90% to about 100%.

9. The organic light emitting device of claim 1, wherein the substrate comprises one or more of glass, plastic, polymer, or metal.

10. The organic light emitting device of claim 1, wherein the thickness of each of the first intermixed layer and the second intermixed layer is in a range of above 0 to about 6,000 nm.

11. The organic light emitting device of claim 1, wherein the concentration of the component of the first passivation layer and the concentration of the component of the second passivation layer gradually decreasing in directions extending from the first passivation layer to the substrate and from the second passivation layer to the substrate, respectively.

12. An organic light emitting device, comprising:
a substrate on which an organic light emitting unit is formed, wherein the organic light emitting unit sequentially comprises a first electrode, an organic layer, and a second electrode;
a first passivation layer formed on the substrate and the organic light emitting unit;
ions implanted into the first passivation layer;
a second passivation layer formed on the first passivation layer;
ions implanted into the second passivation layer;
a first intermixed layer disposed between the substrate and the first passivation layer, wherein the first intermixed layer comprises a component including the substrate, a component including the first passivation layer, and a component including implanted ions;
a second intermixed layer disposed between the first passivation layer and the second passivation layer, wherein the second intermixed layer comprises a component including the first passivation layer, a component including the second passivation layer, and a component including implanted ions; and
in the first intermixed layer and the second intermixed layer, the concentration of the component of the first passivation layer and the concentration of the component of the second passivation layer gradually changing in directions extending from the first passivation layer and from the second passivation layer, respectively.

13. The device of claim 12, wherein the first passivation layer and the second passivation layer are formed of different components, and the components each independently comprise one selected from the group consisting of a metal, an oxide, a nitride, a nitric oxide, and mixtures thereof.

14. The device of claim 13, wherein the metal comprises one or more of Al, Ag, Yb, Si, Ti, W, Zn, Mg, or Ni.

15. The device of claim 13, wherein the oxide comprises one or more of $MoO_x$ where x=2-4, $Al_2O_3$, $Sb_2O_3$, BaO, CdO, CaO, $Ce_2O_3$, CoO, $Cu_2O$, DyO, GdO, $HfO_2$, $La_2O_3$, $Li_2O$, MgO, NbO, NbO, NiO, $Nd_2O_3$, PdO, $Sm_2O_3$, ScO, $SiO_2$, SrO, $Ta_2O_3$, TiO, $WO_3$, $VO_2$, YbO, $Y_2O_3$, ZnO, or ZrO.

16. The device of claim 13, wherein the nitride comprises one or more of AlN, BN, NbN, SiN, TaN, TiN, VN, YbN, or ZrN.

17. The device of claim 13, wherein the nitric oxide comprises SiON or AlON.

18. The device of claim 12, wherein each of the first passivation layer and the second passivation layer has a light transmissivity in a range of about 90% to about 100%.

19. The device of claim 12, wherein the substrate is formed of one or more of glass, plastic, polymer, or metal.

20. The device of claim 12, wherein the ion beams comprise one or more selected from the group consisting of He, Ne, Ar, Kr, Xe, $N_2$, and $O_2$.

* * * * *